United States Patent [19]

Uno et al.

[11] Patent Number: 4,737,440
[45] Date of Patent: Apr. 12, 1988

[54] PHOTOGRAPHIC MATERIALS

[75] Inventors: Akira Uno, Matsudo; Yasuhiro Aizawa, Tokyo; Akira Ninohira, Funabashi; Toshihiko Ueoka, Tokyo, all of Japan

[73] Assignee: Mitsubishi Paper Mills, Ltd., Tokyo, Japan

[21] Appl. No.: 876,000

[22] Filed: Jun. 19, 1986

[30] Foreign Application Priority Data

Sep. 2, 1985 [JP] Japan .................................. 60-194566
Sep. 12, 1985 [JP] Japan .................................. 60-202625

[51] Int. Cl.$^4$ ........................... G03C 5/54; G03C 1/76
[52] U.S. Cl. .................................... 430/227; 430/202; 430/204; 430/531; 430/533; 430/534; 430/536; 430/302; 430/950
[58] Field of Search ............... 430/204, 202, 531, 533, 430/534, 536, 227, 302, 950; 428/500, 515, 516, 520, 483; 427/445

[56] References Cited

U.S. PATENT DOCUMENTS 4,350,797 9/1982 Marzola .............................. 428/483
4,423,185 12/1983 Matsamoto .......................... 428/500

OTHER PUBLICATIONS

Encyclopedia of Chemical Technology, Kirk-Othmer, Mixing and Blending, vol. 15, 1981, pp. 631-632.

*Primary Examiner*—Paul R. Michl
*Assistant Examiner*—Patrick Doody
*Attorney, Agent, or Firm*—Cushman, Darby & Cushman

[57] ABSTRACT

There are disclosed photographic materials which comprise a synthetic plastic film such as a polyester film having on one surface a resin layer comprising a resin composition containing at least 50 parts by weight (based on the total weight of the resin layer) of a polyolefin which has undergone at least one kneading or a resin layer comprising a resin composition containing 50 to 95 parts by weight (based on the total weight of the resin layer) of said polyolefin and 5 to 50 parts by weight (based on the total weight of the resin layer) of a high-density polyethylene.

Further disclosed is a photographic material which comprises a synthetic plastic film having on one surface a layer of the above composition and on another surface a resin layer which contains at least one of carboxy-modified polyolefin, ethylene-ethyl acrylate copolymer, ethylene-vinyl acetate copolymer and polyolefin.

27 Claims, No Drawings

PHOTOGRAPHIC MATERIALS

BACKGROUND OF THE INVENTION

This invention relates to photographic materials, more particularly it relates to photographic materials which comprises a synthetic plastic film coated with a resin and which have very few pits formed on the surface of the resin.

As a support for photographic materials, for example, lithographic printing plates, there are used metallic plates such as aluminum plate, zinc plate, etc., plastic films, paper materials, among which suitable supports are chosen considering printing endurance and other printing characteristics such as ink stains formed while printing, adhesion strength between image forming layer and support, and besides production cost, handling properties.

Recently, automatic plate making and automatic printing systems have been remarkably spread in office light printings and lithographic printing plates excellent in printing endurance and suitable for various platemaking processes have been used.

Usually, plate-making from lithographic printing plate is carried out by giving imagewise exposure from the top side of the plate (i.e. image forming layer side with reference to the support) by a process camera having a reversing mirror (often referred to as "top face exposure method" hereinafter). In this case, the support of lithographic printing plates may not be transparent and various metallic plates and paper materials may also be used as the support. However, when the plate-making is carried out by giving an imagewise exposure from the back side of the photographic material for lithographic printing plates (i.e. the side opposite to the image forming layer) by a process camera with no reversing mirror (often referred to as "back face exposure method" hereinafter), the support is required to be transparent and so metallic plates and paper materials cannot be used as the support and plastic films high in transparency are used.

The photographic materials of this invention can be used not only for the ordinary lithographic printing plates of the top face exposure type, but also for especially the lithographic printing plates of back face exposure type. The so-called back face exposure method according to which an imagewise exposure is carried out from the back side of the photographic materials by a process camera containing no reversing mirror is disclosed, for example, in Japanese Patent Unexamined Publication (KOKAI) No. 89007/73.

Because of excellent transparency, plastic films are used for various photographic materials and are also suitable as the support of photographic materials for lithographic printing plates of back face exposure type.

For supports of photographic materials for lithographic printing plates which are strongly required to have characteristics such as elongation and stiffness, polyester films are suitable although various plastic films such as triacetate films, polycarbonate films, polystyrene films, polypropylene films, polyvinyl chloride films, and the like may be used.

Photographic materials, especially those for lithographic printing plates, are used under high printing pressures and hence the surface of support and image forming layer (which might be referred to as "an emulsion layer" hereinafter) must sufficiently adhere to each other. However, due to poor surface activity of synthetic plastic films such as polyester films per se, it is difficult to directly coat the emulsion on the surface of the films and besides, even when the emulsion is coated after surface activation treatment such as corona discharge treatment, significant problems such as peeling of emulsion layer (frilling) occur during a sequence of photographic treatments due to difference in heat shrinkage of polyester film and the emulsion layer.

Adhesion between the polyester film and the emulsion layer can be increased by providing on the polyester film a resin layer of other resins such as polyolefins which are thermoplastic resins.

In general, the resin layers are provided by the melt extrusion coating method. When a polyester film is coated with a resin, generally both surfaces of the polyester film are coated with the resin when back face exposure method is employed.

As a support for lithographic printing plate for back face exposure method, it is especially preferred in view of transparency to provide a mirror-like surface polyolefin resin layer on both surfaces of the polyester film. However, in this case, since the both surfaces are mirror-like surfaces, there is caused severe blocking (sticking between the top surface and the back surface) after having been taken-up in a reeler part and practicality is completely lost. Of course, when a back coat layer is provided in-line with melt extrusion coating, then both surfaces may be mirror-like. In order to improve the above defect, it is considered to provide roughened surface polyolefin resin layer on both surfaces of the polyester film, but in this case, the deterioration in the transparency is large due to the roughening finish and furthermore, blurs (unclear images or lines) occur and thus such materials cannot be used for lithographic printing plates for the back face exposure method. For the same reasons, materials wherein the surface on which an emulsion is coated is mirror-like and the back surface is a roughened surface cannot be used as lithographic printing plates for the back face exposure method.

Therefore, for a support of lithographic printing plates for the back face exposure method, it is necessary to provide a mirror-like surface resin layer on the back surface, namely, on the surface on which no emulsion is coated. In this case, as mentioned herein-before, the melt extrusion coating method is generally used. When, for example, the ordinary low-density polyethylene resin is coated on a polyester film by this melt extrusion method, fine pores (called "pits" hereinafter) are often formed on the surface of the coated resin. These pits cause loss of microscopic uniformity of the mirror-like surface resin layer on the back side and hence when imagewise exposure is given by the back face exposure method, light does not transmit uniformly therethrough and lithographic printing plates made therefrom have blurs (unclear images or lines).

As a result of the inventor's intensive research to improve the above problems, it has been found that a photographic material which comprises a synthetic plastic film, e.g., a polyester (abbreviated as "PET" hereinafter) film which has on one surface a resin layer comprising a resin composition containing at least 50 parts by weight (based on the total weight of the resin layer) of a polyolefin which has undergone at least one kneading, preferably a resin composition containing 50 to 95 parts by weight (based on the total weight of the resin layer) of said polyolefin and 5 to 50 parts by weight, more preferably 10 to 30 parts by weight (based on the total weight of the resin layer) of a high-density polyethylene has very few pits on the surface and is suitable especially as a support for lithographic printing plates according to back face exposure method.

SUMMARY OF THE INVENTION

One object of this invention is to provide a photographic material which comprises a synthetic plastic film, e.g., PET film having on one or both surfaces a resin layer with very few pits formed thereon.

Another object of this invention is to provide a photographic material which comprises a synthetic plastic film, e.g., a PET film, having on one or both surfaces a resin layer wherein there are formed very few pits on the resin surface and the adhesion strength between the film and the resin layer is sufficiently high.

Another object of this invention is to provide a photographic material suitable for lithographic printing plate for back face exposure method.

Another object of this invention is to provide a photographic material suitable for lithographic printing plate for top face exposure method.

Another object of this invention is to provide a photographic material suitable for photographic films.

Another object of this invention is to provide a photographic material suitable for diffusion transfer process.

That is, this invention relates to a photographic material which comprises a synthetic plastic film such as a polyester film having on one surface a resin layer (called "layer (A)" hereinafter) comprising a resin composition containing at least 50 parts by weight (based on the total weight of the resin layer) of a polyolefin which has undergone at least one kneading or a resin layer (called "layer (B)" hereinafter) comprising a resin composition containing 50 to 95 parts by weight (based on the total weight of the resin layer) of said polyolefin and 5 to 50 parts by weight (based on the total weight of the resin layer) of a high-density polyethlene.

This invention further relates to a photographic material which comprises a synthetic plastic film having on one surface the layer (A) and on another surface a resin layer (called "layer (C)" hereinafter) which contains at least one of carboxy-modified polyolefin (abbreviated as "CPE" hereinafter), ethylene-ethyl acrylate copolymer (abbreviated as "EEA" hereinafter), ethylene-vinyl acetate copolymer (abbreviated as "EVA" hereinafter) and polyolefin (abbreviated as "PO" hereinafter).

As one representative example of the embodiments of this invention, there may be mentioned the photographic material defined above where an image forming layer is provided on the layer (C) (embodiment 1).

Furthermore, as another embodiment there may be mentioned the photographic material defined above wherein an image forming layer is provided on the layer (A) or (B) (embodiment 2).

The material of embodiment 1 is suitable not only as lithographic printing plates for top face exposure method, but also as those for back face exposure method. The photographic materials of embodiment 2 are used as lithographic printing plates for top surface exposure method, photographic films (for example, silver-dye-bleach process) and those for diffusion transfer process.

Thus, this invention further relates to a photographic material for back face exposure method wherein an image forming layer is provided on the layer (C).

Furthermore, this invention relates to a photographic material for lithographic printing plates for top face exposure method, photographic films and for diffusion transfer process wherein an image forming layer is provided on the layer (A) or (B).

Furthermore, this invention relates to a photographic material wherein the surface of the layer (C) which contacts with the image forming layer is a roughened surface and the surface of the layer (A) or (B) is a mirror-like surface.

The advantage brought about by employing a roughened surface as the surface to be coated with an emulsion and a mirror-like surface as the surface of the resin layer on back side of the plastic film is improvement in traveling property during processing. That is, if the surface to be coated with an emulsion is a mirror-like surface of resin layer and the back surface is a roughened surface of a resin layer as in the conventional materials, ordinarily, the back side layer is firstly provided and then emulsion is coated on the mirror-like surface. Thus, when back coating is effected, the mirror-like layer is on underside and so the mirror-like surface contacts with the surface of guide roll to often produce scuff marks or to cause slippage from the guide roll and traveling like fish-tail. On the other hand, according to this invention, since the surface to be coated with emulsion is a roughened surface of resin layer, no such problems occur and good traveling property can be obtained.

The number of kneadings of polyolefin resins in this invention, namely, at least one kneading, does not include one kneading for pelletization after polymerization by manufacturer of polyolefin resin and one kneading in extruder for extrusion coating by users. That is, for example, two kneadings (kneading twice) in this invention means that pellets of a polyolefin resin obtained by pelletization by an extruder after polymerization by a maker of the resin is supplied to a user and the user kneads the pellets by Banbury mixer, then further kneads thus kneaded product by an extruder to repelletize it and then feeds the pellets to an extruder for extrusion coating to extrusion-coat the resin on a synthetic plastic film. Thus, the two kneadings in this case are the kneading by the Banbury mixer and the subsequent kneading for repelletization.

It is most effective for prevention of formation of pits to coat by extrusion only the polyolefin which has undergone at least one kneading on at least one surface of a synthetic plastic film, but some polyethylene such as low-density polyethylene, medium-density polyethylene, etc. may be combined considering adhesion between the plastic film and polyolefin and surface hardness of the resins. In this case, unless the polyolefin which has undergone at least one kneading is contained in an amount of at least 50 parts by weight, the effect of preventing the formation of pits cannot be obtained. Other thermoplastic resins such as CPE, EEA, EVA may be optionally added in an amount of less than 50 parts by weight.

The polyolefins used in this invention which have undergone the given number of kneadings may be produced by Banbury mixer which is normally used as a kneader or an extruder for kneading or by combination of them.

The kneading is carried out at a resin temperature of 140°–230° C., preferably less than 200° C. to prevent deterioration of resin. A heat stabilizer may be previously added to the resin. Any heat stabilizers may be used and examples thereof are 3,5-di-tert-butyl-4-hydroxytoluene, tetrakis[methylene(3,5-di-tert-butyl-4-hydroxy-hydrocinnamate]methane, 2,6-di-tert-butyl-4-methyl-phenol, etc.

The number of kneadings of polyolefin resin is desirably as many as possible so long as heat deterioration does not occur, but should be determined considering desired quality and cost.

Therefore, this invention also relates to a photographic material which comprises a synthetic plastic film having on one surface the layer (C), namely, the resin layer containing at least one of CPE, EEA, EVA and PO, on which an image forming layer is provided and on another surface the layer (A) or (B) as defined above.

Photographic materials having an image forming layer on the layer (A) or (B) defined above have very few pits to form a smooth surface and can provide a high sharpness. These photographic materials are suitable for lithographic printing plates for top side exposure method and for photographic films.

In order to counteract any curling tendency of the photographic materials, a back coat layer mainly composed of gelatin may be provided on the resin layer opposite to the image forming layer side.

The inventors have further made intensive researches in an attempt to attain remarkable improvement of adhesion strength between, for example, a polyester (abbreviated as "PET" hereinafter) film and a resin layer from another viewpoint to find that sufficient result can be obtained when especially the surface of, for example, PET which contacts with the resin layer on the image forming layer side is allowed to have a contact angle of 42° to 55°, preferably 42° to 50° by surface activation treatment such as corona discharge treatment.

When the surface of PET is surface treated so that it has a contact angle within the range as above, adhesion to even PO which has been insufficient becomes nearly satisfactory.

It has been further found that when CPE, EEA or EVA is extrusion-coated on PET, sufficient adhesion strength can be obtained even with a contact angle outside the above range, but the adhesion strength is further improved by adjusting the contact angle to one within the above range.

Hitherto, it has been considered that the adhesion strength between paper and PO becomes higher with increasing the degree of, for example, corona discharge treatment of the paper. However, it has been found that a synthetic plastic film, for example, PET has an optimum corona discharge quantity (optimum contact angle). That is, there has been found the suprising fact that an extremely strong corona discharge (less than 40° in terms of contact angle) is given, the adhesion strength rather decreases. Naturally, sufficient adhesion strength cannot be obtained if corona discharge treatment is not given or is small in degree.

Thus, this invention further relates to a photographic material comprising a synthetic plastic film and a resin layer or layers provided on at least one surface of the film, wherein the surface of the synthetic plastic film on which the resin layer is to be provided has a contact angle of 42° to 55°, preferably 42° to 50° resulting in a satisfactory adhesion strength.

The contact angle in this invention is measured by droplet method with distilled water using the device for measurement of face contact angle (manufactured by Kyowa Kagaku Co.). That is, surface of a film is subjected to corona discharge treatment at various intensities by a corona discharge device provided in line with an extrusion coater and thereafter the contact angle is measured by the device for measurement of face contact angle provided in a thermohygrostatic chamber (20° C.–65% RH).

At least one of the layers of the photographic materials of this invention including the synthetic plastic film can be translucent or opaque and these materials are suitable to be used as photographic films and when the layer (A) or (B) adjacent to the image forming layer is opaque, the sharpness is improved. Further, these materials can be used for making poster materials which are to be seen from front side with a light source being placed on back side. The layers can be made translucent and opaque by the addition of $TiO_2$, $ZnO$, alumina, silica, $CaCO_3$, etc. For example, when $TiO_2$ is added to the layer (A), generally, it is added in an amount of 1 to 9, preferably 3 to 7% by weight for translucent layer and 7 to 20, preferably 9 to 16% by weight for substantially opaque layer, although it also depends on thickness of the layer.

An image forming layer is provided on the resin layer (A), (B) or (C) of the photographic materials of this invention. The image forming layers include an emulsion layer, an image receiving layer containing physical development nuclei for diffusion transfer process. Photographic materials having the image forming layers on both sides are useful as X-ray films.

Thus obtained photographic materials of this invention which have the image forming layer are image-wise exposed from the side opposite to the image forming layer side by a process camera having no reversing mirror (back side exposure method) or from the image forming layer side by a process camera having a reversing mirror (top side exposure method).

As the synthetic plastic films, mention may be made of, for example, those of triacetate, polycarbonate, polystyrene, polypropylene, polyvinyl chloride, polyester, etc., but polyester film is especially preferred in this invention.

As the polyester film in this invention, use may be made of the types undrawn and drawn mono- or bi-axially. In view of the nonextensibility, stiffness, and thermal stability, however, a polyester film of the biaxially drawn type is most suitable. The thickness of the film can be in the range of 75 to 350 μ, but preferably 100 to 188 μ in view of performance and cost.

The carboxy-modified polyethylene used in this invention is a polyethylene containing

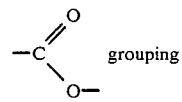 grouping in the molecule, such as, for example, a polyethylene modified by grafting thereon an unsaturated carboxylic acid. The unsaturated carboxylic acids include α, β-unsaturated carboxylic acids such as maleic acid, acrylic acid, and methacrylic acid, and cycloaliphatic polybasic carboxylic acids having unsaturated bonds in the molecule. Anhydrides, amides, and esters of these acids are used in the grafting reaction. Various polyethylenes modified with various unsaturated carboxylic acids and having various densities and melt indices can be used each alone or in mixtures. Especially preferred is a carboxy-modified low-density polyethylene. A mixture of such a modified polyethylene with a suitable amount of polyolefins such as low-, medium-, or high-density polyethylene may also be used.

The ethyl acrylate content of the ethylene-ethyl acrylate copolymer used in this invention is not subject to any special restriction but is generally 5 to 20%, preferably 7 to 18%. The copolymers having various densities and melt indices are used each alone or in mixtures. Other resins such as, polyolefins, for example, low-, medium-, and high-density polyethylenes can be admixed in suitable amounts insofar as the adhesiveness is not injured. When ethyl acrylate content is about 18%, amount of the copolymer is preferably less than 75% because blocking to cooling roll is too large and sometimes sticking to the roll occurs.

The ethylene-vinyl acetate copolymer used in this invention generally contains 6 to 40% by weight, preferably 6 to 28% by weight of vinyl acetate. Those of various densities and various melt viscosity indexes may be used singly or in combination. Furthermore, other resins such as low-density polyethylene, medium-density polyethylene and high-density polyethylene may be optionally added so long as the adhesion is not impaired.

If necessary, carboxy-modified polyethylene, ethylene-ethyl acrylate copolymer and ethylene-vinyl acetate copolymer may be used in admixture. Furthermore, polyolefin may be added thereto.

The polyolefins used according to this invention include homopolymers such as low-density polyethylene, medium-density polyethylene, high-density polyethylene, polypropylene, polybutene, and polypentene; copolymers of two or more olefins such as ethylene-propylene copolymers, linear low-density polyethylenes which are copolymers of ethylene and α-olefin and mixtures of these polymers. The polyolefins having various densities and melt indices (sometimes referred to as MI) are used each alone or in combinations.

Although not restricted to any specific value, the thickness of each layer provided on both sides of polyester film is generally 10 to 70 μ, preferably 20 to 40 μ.

The roughened surface resin layer according to this invention is formed by means of cooling roll commonly used in melt extrusion coating, which have been subjected to roughening finish on the surface. The allowable extent of roughening covers a wide range from a slight roughening sufficient for preventing the blocking between roughened surface resin layer and the mirror-like surface resin layer to an intense roughening so far as adverse effects are not exerted on the transparency and blurs are not formed and the like when an emulsion layer is provided on the roughened surface resin layer and used in the back face exposure. The mirror-like surface resin layer is formed by means of cooling rolls similar to those described above, which have been subjected to mirror finish on the surface.

The backing layer according to this invention comprises gelatin as major constituent and may contain a hardener and inorganic pigments insofar as the transparency necessary for the back face exposure is not injured and blurs are not formed. The layer can contain other additives such as antistatics, surface active agent, and lattices.

The image forming layer provided on a thermoplastic resin layer of the photographic materials according to this invention is generally a silver halide emulsion layer or an image receiving layer having a physical development nuclei layer for silver complex diffusion transfer process and these photographic materials may be used as various photographic materials. However, the photographic materials of this invention are especially suitable as light-sensitive materials for printing such as lithographic printing plates because of the markedly high adhesion between the polyester film and the thermoplastic resin. In addition, the photographic materials of this invention can be used for those according to silver-dye-bleach method which requires high adhesion. Furthermore, the photographic materials of this invention wherein the polyester film and/or the resin layer are rendered translucent or opaque by inclusion therein of titanium dioxide, etc. can also be used for photographic films or print films (which are display materials for advertisement employed at stations, etc. which contain an illumination lamp on the back side, namely, the side opposite to a viewer.). The invention is illustrated below with reference to examples.

In the following examples the number of pits was measured as follows. The surface of polyolefin resin coated on a synthetic plastic film was magnified to 500 times by BH-2-microscope manufactured by Olympus Optical Co., Ltd. and photographed on a Polaroid plate and then the number of pits having a diameter of 1 mm or more (actual diameter 2 μ) in the area of 1 cm$^2$ was counted. When the number of such pits is more than 50, blur occurs in the printing plate made by back side exposure.

EXAMPLE 1

A low-density polyethylene (MI 6 and density 0.92) was kneaded at the number of times as shown in Table 1 at 190° C. by a kneading extruder.

On one surface of a polyester film of 150 μ thick while having been subjected to corona discharge treatment was melt extrusion coated each of the resins shown in Table 1 at 335° C. at a thickness of 30 μ by extruding from a melt extruder and using a cooling roll with mirror-like surface finish. Subsequently, on another surface of the film while having been subjected to corona discharge treatment was melt extrusion coated the resin of Sample 1 at 335° C. at a thickness of 30 μ using a cooling roll having roughened surface. The number of pits formed on each of these four samples was counted by the above mentioned method. The results are shown in Table 1.

The roughened surface of the resin layer of the four samples was subjected to corona discharge treatment, coated with emulsion for lithographic printing plate (abouve 6 g/m$^2$ in solid content) and dried. The lithographic emulsion layer comprised the following first layer and second layer coated thereon.

The first layer

| | |
|---|---|
| Chlorobromide emulsion (orthochromatic) | 300 g |
| Silver bromide | 20 mol % |
| Silver chloride | 80 mol % |
| Average grain size | 0.4 μ |
| Binder content | 20 g |
| Silver content | 0.1 mol |
| Silica (average particle size 5 μ) | 3 g |
| Formalin (12% aqueous solution) | 3 cc |
| Saponin (10% aqueous solution) | 10 cc |
| Water to make up | 400 g |

The second layer (physical development nuclei hydrosol liquid obtained by mixing the follwoing liquids I and II).

| Liquid I | |
|---|---|
| Palladium chloride | 1 g |
| Hydrochloric acid | 20 cc |
| Water | 250 cc |
| Liquid II | |
| Sodium thiosulfate | 4 g |
| 10% Aqueous saponin solution | 10 cc |
| Water | 1000 cc |

These samples were imagewise exposed from the back side (opposite to the emulsion layer side) and then subjected to a series of photographic treatments to obtain lithographic printing plates. These lithographic printing plates were inspected with a magnifying glass to find no blur in Samples 2-4, but find blurs in Sample 1. These lithographic printing plates were mounted on an offset printing press and printing was carried out to obtain good printed copies with no blur from the printing plates of Samples 2-4, but only the printed copies having blur from the printing plate of Sample 1.

TABLE 1

| Sample No. | Number of kneading | Number of Pits |
|---|---|---|
| 1 | 0 | 66 |
| 2 | 1 | 22 |
| 3 | 2 | 14 |
| 4 | 3 | 7 |

EXAMPLE 2

A medium-density polyethylene (MI 3 and density 0.93) to which was added 200 ppm (of the resin) of 3,5-di-tert-butyl-4-hydroxytoluene was kneaded in Banbury's mixer at 140° C. and thereafter was further kneaded by a kneading extruder at 160° C.

This resin which was thus kneaded twice was dry mixed with a raw material resin which had not undergone the above mentioned two kneadings at a mixing ratio as shown in Table 2.

On one surface of a polyester film of 100 μ thick which was subjected to corona discharge treatment was melt extrusion coated each of the resins shown in Table 2 at a thickness of 20 μ by extruding from a melt extruder at 350° C. and using a cooling roll with mirror-like surface finish. Subsequently, another surface of the film was coated with the same resins as used above at a thickness of 20 μ by melt extrusion coating at 350° C. using a cooling roll with roughened surface finish, while the film surface having been corona-treated. The number of pits formed on each of these five samples was counted by the method as given hereinbefore and the results are shown in Table 2.

Lithographic printing plates were made from these five samples in the same manner as in EXAMPLE 1 except that a back coat layer (about 4 g/m² as solid content) comprising gelatin and a small amount of a hardener was provided on the mirror-like surface resin layer, while the surface having been corona-treated and printing was carried out with these printing plates in the same manner as in EXAMPLE 1. From Samples 5-7 there were obtained lithographic printing plates and printed copies which were both free from blur while from Samples 8 and 9 there were obtained only lithographic printing plates and printed copies which both had blur.

TABLE 2

| | Mixing ratio | | |
|---|---|---|---|
| Sample No. | Resins having undergone no kneading (0 time) | Resins having undergone kneading twice (2 times) | Number of pits |
| 5 | 0 parts by weight | 100 parts by weight | 11 |
| 6 | 25 parts by weight | 75 parts by weight | 20 |
| 7 | 50 parts by weight | 50 parts by weight | 35 |
| 8 | 75 parts by weight | 25 parts by weight | 56 |
| 9 | 100 parts by weight | 0 parts by weight | 64 |

EXAMPLE 3

A low-density polyethylene resin (MI 5 and density 0.92) to which was added 50 ppm (of the resin) of tetrakis[methylene(3,5-di-tert-butyl-4-hydroxy-hydrocinnamate]methane was kneaded by a kneading extruder at 200° C.

This resin which was kneaded once was dry mixed with each of the resins as shown in Table 3 at a mixing ratio as shown in Table 3.

On one surface of a polyester resin having a thickness of 188 μ, while the surface having been corona-treated, was coated each of the mixed resins at 40 μ thick by melt extrusion coating at 320° C. by extruding from a melt extruder and using a cooling roll with mirror-like surface finish. Another surface of the film, while having been corona-treated, was similarly coated with only the carboxy-modified polyethylene used in Sample 14 at a thickness of 40 μ by melt extrusion coating at a resin temperature of 320° C. and using a cooling roll with roughened surface finish. The number of the pits formed on each of these five samples were counted by the method as given hereinbefore and the results are shown in Table 3.

In the same manner as in EXAMPLE 1, lithographic printing plates were made from these five samples and printing was carried out. All the lithographic printing plates made from Samples 10-14 and all the printed copies obtained had no blur.

TABLE 3

| | Mixing ratio | | | |
|---|---|---|---|---|
| Sample No. | Resins having undergone kneading once | Various | resins | Number of pits |
| 10 | 50 parts by weight | MDPE 50 | parts by weight | 38 |
| 11 | 50 parts by weight | LDPE 50 | parts by weight | 45 |
| 12 | 50 parts by weight | EVA 50 | parts by weight | 33 |
| 13 | 50 parts by weight | EEA 50 | parts by weight | 35 |
| 14 | 50 parts by weight | CPE 50 | parts by weight | 41 |

Note:
(1) "MDPE" means medium-density polyethylene (MI 4, density 0.93)
(2) "LDPE" means low-density polyethylene (MI 6, density 0.92)
(3) "EVA" means ethylene-vinyl acetate copolymer (MI 6, density 0.95)
(4) "EEA" means ethylene-ethyl acrylate copolymer (MI 6, density 0.93)
(5) "CPE" means carboxy-modified polyethylene (MI 4, density 0.91)

EXAMPLE 4

A low-density polyethylene (MI 6, density 0.92) was kneaded by a kneading extruder at 190° C.

The above resin which was kneaded once was mixed with a high-density polyethylene and separately a raw material resin, namely, a polyethylene resin which had not undergone any kneading after the kneading for pelletization was mixed with a high-density polyethylene at a mixing ratio as shown in Table 4.

On one surface of a polyester film, while having been corona-treated, was coated each of the resins shown in Table 4 at a thickness of 30 $\mu$ by extruding from a melt extruder at 320° C. and using a cooling roll with mirror-like surface finish. Then, another surface of the film while having been coronatreated was similarly coated with the polyethylene resin of Sample 15 at a thickness of 30 $\mu$ by melt extrusion coating at a resin temperature of 320° C. using a cooling roll with roughened surface finish. The number of the pits formed on these ten samples was counted by the method as given hereinbefore and the results are shown in Table 4.

The roughened surface of the resin layer of these ten samples while having been corona-treated was coated with an emulsion for lithographic printing plate (about 6 g/m² as solid content) of EXAMPLE 1 and then dried. Thereafter, these were imagewise exposed from the side opposite to the emulsion layer side and subjected to a series of photographic treatments to obtain lithographic printing plates. These lithographic printing plates were inspected with a magnifying glass to find that those made from Samples 18–24 had no blur while those from Samples 15–17 showed blur. These lithographic printing plates were mounted on an offset printing press and printing was carried out to obtain good printed copies with no blur when the lithographic printing plates of Samples 18–24 were used and printed copies with blur when the printing plates of Samples 15–17 were used. The Sample 18 had some problems in workability because it developed some curl after application of the emulsion and subjecting to a series of the photographic treatments.

TABLE 4

| Sample No. | Mixing ratio | | | Number of pits |
|---|---|---|---|---|
| | Resins having undergone no kneading (0 time) | Resins having undergone kneading once | High-density polyethylene* | |
| 15 | 100 | — | 0 | 70 |
| 16 | 80 | — | 20 | 64 |
| 17 | 50 | — | 50 | 68 |
| 18 | — | 100 | 0 | 25 |
| 19 | — | 95 | 5 | 16 |
| 20 | — | 90 | 10 | 5 |
| 21 | — | 80 | 20 | 6 |
| 22 | — | 70 | 30 | 8 |
| 23 | — | 60 | 40 | 12 |
| 24 | — | 50 | 50 | 18 |

*This high-density polyethylene had MI of 7 and a density of 0.96.

EXAMPLE 5

A medium-density polyethylene (MI 3, density 0.93) to which was added 100 ppm (of the resin) of tetrakis[-methylene(3,5-di-tert-butyl-4-hydroxy-hydrocinnamate]methane was kneaded at 140° C. in Banbury mixer and thereafter was further kneaded at 160° C. by a kneading extruder.

Thus twice kneaded resin was dry mixed with high-density polyethylene (MI 5, density 0.96) at a mixing ratio as shown in Table 5.

On one surface of a polyester film of 150 $\mu$ thick while having been subjected to corona discharge treatment was coated each of the resins as shown in Table 5 at a thickness of 20$\mu$ by extruding from a melt extruder at 335° C. and using a cooling roll with mirror-like surface finish. Subsequently, another surface of the film while having been subjected to corona discharge treatment was coated with carboxy-modified polyethylene (MI 4, density 0.91) by melt extrusion coating at a resin temperature of 320° C. and at a thickness of 20 $\mu$ using a cooling roll with roughened surface finish. The number of the pits formed on each of thus obtained six samples was counted by the method as given hereinbefore and the results are shown in Table 5.

Lithographic printing plates were made from these six samples in the same manner as in EXAMPLE 4 except that on the mirror-like surface of the resin layer while having been subjected to corona discharge treatment was provided a back coat layer (about 4 g/m² as solid content) comprising gelatin and a small amount of a hardener and printing was carried out. The printed copies had no blur.

TABLE 5

| Sample No. | Mixing ratio | | Number of pits |
|---|---|---|---|
| | Resins having undergone kneading twice | High-density polyethylene | |
| 25 | 50 | 50 | 10 |
| 26 | 60 | 40 | 8 |
| 27 | 70 | 30 | 3 |
| 28 | 80 | 20 | 2 |
| 29 | 90 | 10 | 4 |
| 30 | 95 | 5 | 9 |

EXAMPLES 6–30

On once surface of polyester films having a thickness of 188 $\mu$ (EXAMPLES 6–10), 100 $\mu$ (EXAMPLES 11–20) and 175 $\mu$ (EXAMPLES 21–30) while the surface having been subjected to corona discharge treatment so that the surface had a contact angle as shown in Table 6 was extrusion coated each of the resins as shown in Table 6 by extrusion from a melt extruder at 320° C. and adjusting the thickness to that as shown in Table 6 by a cooling roll with roughened surface finish. The surface of the roughened surface resin layer was also subjected to corona discharge treatment of a specific intensity. Subsequently, another surface of the polyester films while having been subjected to corona discharge treatment of a specific intensity was coated with the resin of the Sample 21 as used for the top surface layer by the extrusion coating at the same thickness as that of the top surface layer using a cooling roll with a mirror-like surface finish.

The roughened surface resin layer of EXAMPLES 6–30 thus obtained was coated with an emulsion for lithographic printing plate (about 6 g/cm² as solid content) of EXAMPLE 1, then dried and thereafter was imagewise exposed from the side opposite to the emulsion layer and subjected to a series of photographic treatments to obtain lithographic printing plates.

The surface of these lithographic printing plates was inspected with a magnifying glass to find no blur. Furthermore, these lithographic printing plates were mounted on an offset printing press and printing was carried out to obtain printed copies of excellent finish with no blur. However, from those which had a contact angle of 40° and 60° at polyester film surface were obtained less than 5,000-8,000 satisfactory copies while from those where the contact angle was 42°-55° were obtained more than 10,000 satisfactory copies and especially when the contact angle was 42°-50°, more than 20,000-50,000 clear copies were obtained.

TABLE 6

| EXAMPLES | Kind of resins | Density | MI | Amount of resin % | Kind of resins | Density | MI | Amount of resin % | Thickness of resin layer μ | Contact angle θ | Number of printed copies with no problems |
|---|---|---|---|---|---|---|---|---|---|---|---|
| 6 | Low-density polyethylene | 0.92 | 5 | 100 | | | | | 20 | 40 | less than 5,000 |
| 7 | | | | | | | | | " | 42 | more than 20,000 |
| 8 | | | | | | | | | " | 50 | more than 20,000 |
| 9 | | | | | | | | | " | 55 | more than 10,000 |
| 10 | | | | | | | | | " | 60 | less than 5,000 |
| 11 | Carboxy-modified polyethylene | 0.91 | 4 | 100 | | | | | 30 | 40 | 6,500-7,000 |
| 12 | | | | | | | | | " | 42 | more than 50,000 |
| 13 | | | | | | | | | " | 50 | more than 50,000 |
| 14 | | | | | | | | | " | 55 | more than 25,000 |
| 15 | | | | | | | | | " | 60 | 7,500-8,000 |
| 16 | Carboxy-modified polyethylene | 0.91 | 4 | 50 | Low-density polyethylene | 0.92 | 6 | 50 | 30 | 40 | 5,000-6,000 |
| 17 | | | | | | | | | " | 42 | more than 40,000 |
| 18 | | | | | | | | | " | 50 | more than 40,000 |
| 19 | | | | | | | | | " | 55 | more than 20,000 |
| 20 | | | | | | | | | " | 60 | 6,500-7,000 |
| 21 | Ethylene-ethylacrylate copolymer | 0.93 | 6 | 100 | | | | | 40 | 40 | less than 6,000 |
| 22 | | | | | | | | | " | 42 | more than 30,000 |
| 23 | | | | | | | | | " | 50 | more than 30,000 |
| 24 | | | | | | | | | " | 55 | more than 15,000 |
| 25 | | | | | | | | | " | 60 | 6,500-7,000 |
| 26 | Ethylene-ethylacrylate copolymer | 0.93 | 6 | 20 | Low-density polyethylene | 0.93 | 7 | 80 | " | 40 | less than 5,000 |
| 27 | | | | | | | | | " | 42 | more than 20,000 |
| 28 | | | | | | | | | " | 50 | more than 20,000 |
| 29 | | | | | | | | | " | 55 | more than 10,000 |
| 30 | | | | | | | | | " | 60 | less than 5,000 |

EXAMPLE 31

Samples were made in the same manner as in EXAMPLE 1 except that the emulsion was coated on the mirror-like surface resin layer. The surface of the emulsion layer was highly smooth. These samples were imagewise exposed from the top side, namely, from the emulsion layer side. The resultant images had high sharpness.

EXAMPLE 32

Samples were made in the same manner as in EXAMPLE 31 except that a silver halide emulsion was used as the emulsion. The surface of the emulsion layer was highly smooth and the resultant images had high sharpness.

What is claimed is:

1. A photographic material which comprises a synthetic plastic film and a resin layer (A) which contains at least 50 parts by weight (based on the total weight of the resin layer) of a polyolefin having undergone at least one kneading and which is provided on one surfasce of said synthetic plastic film,
wherein an image forming layer is provided on the layer (A).

2. A photographic material which comprises a synthetic plastic film and a resin layer (A) which contains at least 50 parts by weight (based on the total weight of the resin layer) of a polyolefin having undergone at least one kneading and which is provided on one surface of said synthetic plastic film, and resin layer (B) which contains 50 to 95 parts by weight (based on the total weight of the resin layer) of the polyolefin having undergone at least one kneading and 5 to 50 parts by weight (based on the total weight of the resin layer) of a high density polyethylene,
wherein an image forming layer is provided on the layer (B).

3. A photographic material according to claim 1 wherein the polyolefin has been undergone at least two kneadings.

4. A photographic material according to claim 3 wherein the polyolefin has undergone at least three kneadings.

5. A photographic material according to claim 1 wherein the polyolefin is a low-density polyethylene or a medium-density polyethylene.

6. A photographic material according to claim 1 wherein the synthetic plastic film is a polyester film.

7. A photographic material according to claim 1 wherein a back coat layer is provided on the layer (A).

8. A photographic material according to claim 2

9. A photographic material according to claim 1 wherein the surface of the layer (A) is a mirror-like surface.

10. A photographic material according to claim 2 wherein the surface of the layer (B) is a mirror-like surface.

11. A photographic material according to claim 1 which additionally has resin layer (C) which contains at least one of carboxy-modified polyethylene, ethylene-ethyl acrylate copolymer, ethylene-vinyl acetate copolymer and polyolefin and which is provided on another surface of the synthetic plastic film which is opposite to the layer (A) side.

12. A photographic material according to claim 2 which additionally has layer (C) on another surface of the synthetic plastic film which is opposite to the layer (B) side.

13. A photographic material according to claim 11 wherein an image forming layer is provided on the layer (C).

14. A photographic material according to claim 12 wherein an image forming layer is provided on the layer (C).

15. A photographic material according to claim 9 wherein an image forming layer is provided on the layer (A).

16. A photographic material according to claim 12 wherein an image forming layer is provided on the layer (B).

17. A photographic material according to claim 13 wherein the surface of the layer (A) is a mirror-like surface.

18. A photographic material according to claim 14 wherein the surface of the layer (B) is a mirror-like surface.

19. A photographic material according to claim 17 wherein the surface of the layer (C) is a roughened surface.

20. A photographic material according to claim 13 wherein the surface of the synthetic plastic film on which the layer (C) is provided has a contact angle of 42° to 55°.

21. A photographic material according to claim 20 wherein the contact angle is 42° to 50°.

22. A photographic material according to claim 13 wherein a back coat layer is provided on the layer (A).

23. A photographic material according to claim 14 wherein a back coat layer is provided on the layer (B).

24. A method for making a lithographic printing plate which includes imagewise exposure given to the photographic material of claim 19 from the side opposite to the image forming layer side by a process camera containing no reversing mirror.

25. A method for making a lithographic printing plate which includes imagewise exposure given to the photographic material of claim 9 from the image forming layer side by a process camera containing a reversing mirror.

26. A photographic material according to claim 9 wherein the image forming layer on the layer (A) is a silver halide emulsion layer.

27. A photographic material according to claim 9 wherein the image forming layer comprises a silver halide emulsion layer and a physical development nuclei-containing image receiving layer for diffusion transfer process.

* * * * *